United States Patent [11] 3,620,833

[72] Inventors Paul S. Gleim
Dallas;
Kenneth E. Bean, Richardson, both of Tex.
[21] Appl. No. 604,300
[22] Filed Dec. 23, 1966
[45] Patented Nov. 16, 1971
[73] Assignee Texas Instruments Incorporated
Dallas, Tex.

[54] INTEGRATED CIRCUIT FABRICATION
5 Claims, 13 Drawing Figs.

[52] U.S. Cl. .......... 117/212,
117/93.3, 117/106 A, 117/215, 148/174, 148/175
[51] Int. Cl. .......... C23c 13/04,
H01l 1/00
[50] Field of Search .......... 117/93.3,
212, 215, 200, 106 A; 148/174, 175

[56] References Cited
UNITED STATES PATENTS

| | | | |
|---|---|---|---|
| 3,390,012 | 6/1968 | Haberecht | 117/212 |
| 3,385,729 | 5/1968 | Larchian | 117/106 X |
| 3,364,087 | 1/1968 | Solomon et al. | 117/93.3 |
| 3,391,023 | 7/1968 | Frescura | 117/212 |
| 3,381,182 | 4/1968 | Thornton | 29/589 X |
| 3,372,063 | 3/1968 | Suzuki | 317/234 |
| 3,332,137 | 7/1967 | Keeney | 29/589 X |
| 3,326,729 | 6/1967 | Sigler | 117/106 X |

*Primary Examiner*—Alfred L. Leavitt
*Assistant Examiner*—Alan Grimaldi
*Attorneys*—Samuel M. Mims, Jr., James O. Dixon, Andrew M. Hassell, Harold Levine and Gerald B. Epstein

ABSTRACT: An integrated circuit structure having a plurality of monocrystalline semiconductor islands separated by a layer of dielectric insulation is fabricated by a method which begins with the formation of a plurality of nucleation sites upon a supported layer of insulating material. A single crystallite of semiconductor material is then vapor deposited at each of the nucleation sites. The crystallites are then covered by the vapor deposition of a second layer of dielectric material. The second layer of dielectric material is then supported by the deposition of a substrate material, followed by removal of the original supporting body to expose the first layer of insulating material, thereby providing a plurality of electrically isolated regions of single crystallite semiconductor material embedded in a suitable substrate. The structure is then completed by forming and interconnecting desired circuit components within the single crystallites.

INVENTOR
Paul S. Gleim
Kenneth E. Bean
BY Kenneth R. Glaser
ATTORNEY

INTEGRATED CIRCUIT FABRICATION

This invention relates to integrated circuits, and more particularly to techniques for producing single crystallites of semiconductor material in a single substrate from which individual circuit components of an integrated circuit may be fabricated.

Recent developments in the integrated circuit field have placed increased demand upon individual components of an integrated circuit being in very close physical proximity to one another on a single substrate as well as being electrically insulated from one another through the substrate. In addition, the increased demands for faster switching circuits of the integrated circuit type place the additional requirement that the distance between components be held to a minimum to avoid the use of relatively long leads or interconnections between components which contribute stray capacitance due to their length, this additional capacitance placing severe limitations on the speed of circuit operation.

It is therefore an object of the invention to provide a method of producing single crystallites of semiconductor material on a single insulating substrate, integrated circuit components then being fabricated in each of the single crystallites.

It is another object of the invention to provide a method of producing high density electrically isolated regions of semiconductor material on a single substrate, circuit components of an integrated circuit being fabricated from these isolated regions of semiconductor material.

In accordance with these and other objects, the invention is directed to the formation of single crystallites of semiconductor material upon an insulating layer which has been previously deposited on a supporting substrate of semiconductor material. By a single crystallite is meant a region of semiconductor material monocrystalline in nature. Each of these crystallites may be of a different crystalline orientation with respect to one another, but the process is so controlled so that crystallites of various orientations do not "grow" together to form polycrystalline material. A layer of dielectric material is then deposited over the single crystallite regions followed by a thicker layer of polycrystalline semiconductor material, and the material of the original wafer is then removed leaving the crystallite regions electrically isolated from one another and from the substrate. Individual circuit components may then be fabricated in or on these single crystallites of semiconductor material. In accordance with the invention, the single crystallites may be selectively deposited upon the insulating layer or may be randomly distributed, scanning and computer techniques thereafter being utilized to locate each of the single crystallites for the subsequent formation of circuit components.

Various other objects, features and advantages of the invention will become apparent from the following description, appended claims and attached drawings wherein:

Figure 1:
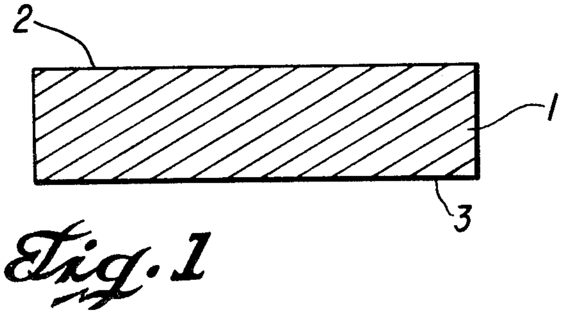
FIGS. 1–7 are elevational views, in section, taken at various stages of the fabrication of a segment of a semiconductor wafer having epitaxially deposited single crystallites of semiconductor material at preselected nucleation sites.

Referring now to the drawings, FIG. 1 represents a wafer or slice 1 of semiconductor material having polished surfaces 2 and 3 and a thickness of about 10–15 mils by way of example. Neither the thickness chosen nor the material of the body 1 is critical in as much as the wafer 1 forms no part of the final product, serving only as a supporting substrate during the fabrication in accordance with the invention, after which it is removed by lapping or etching. Accordingly, the substrate 1 could be of single crystalline semiconductor material, polycrystalline semiconductor material, or some other type of material that has a similar coefficient of thermal expansion as that of layer 9, and is easily etched or lapped. In the particular example, monocrystalline silicon was chosen as the material of the wafer 1.

Figure 2:
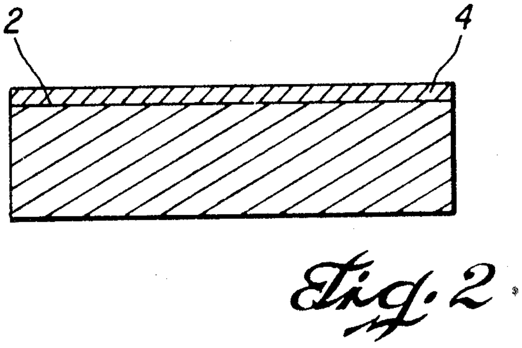

A thin layer 4 of insulating material, formed of silicon dioxide ($SiO_2$) for example, to a thickness of approximately 15,000 A is deposited upon the wafer or substrate surface 2 as illustrated in FIG. 2. The material of the layer 4 may be formed of various dielectric media besides silicon oxide, for example silicon nitride. When the layer 4 is of silicon dioxide, it may be formed by the thermal oxidation of the wafer 1 or alternatively may be deposited to the desired thickness in a vapor deposition reactor of the type well known in the art.

Figure 3:
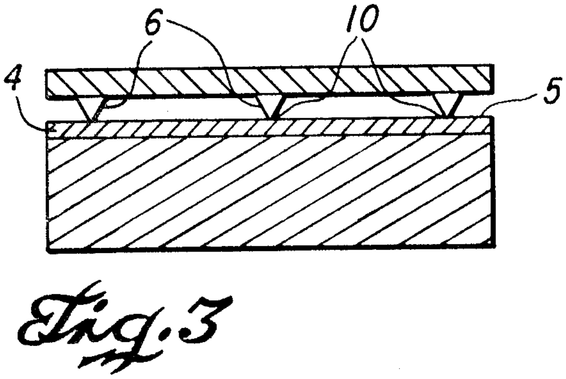
Figure 4:
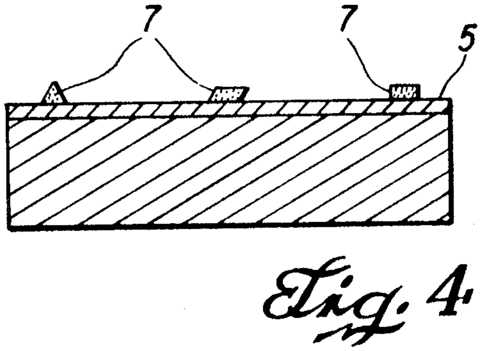

As the next step in the process of the invention, nucleation sites for the subsequent growth or formation of the single crystallites are selectively formed at the sites 10 on the surface 5 of the silicon dioxide layer 4, as illustrated in FIG. 3. This selective formation of the nucleation sites favorable for crystal growth is accomplished by bringing into contact with the surface 5 a plurality of tips 6, arranged in a pattern corresponding to the desired pattern of crystal sites, and having thereon a suitable nucleating agent which, when imprinted on the surface 5, leaves portions of the nucleating agent on the surface. Examples of some nucleating agents which may be selectively imprinted on the surface 5 are various organic compounds, inorganic salts, bases and acids, diluted photosensitive resist composition as KMER Kodak Metal Etch Resist) being one such suitable nucleating agent. An alternate approach to the selective provision sites on the surface 5 of the oxide layer 4 involves a technique whereby the tips 6 may be used to create slight indentations at the selective sites 10. This selective damage of the silicon dioxide layer creates sites at which the probability of crystal growth is maximized. Alternately, the selective damage may be accomplished by selectively directing a beam of concentrated energy, as an electron beam, upon the surface 5. Desirably, the diameters of the nucleation sites should be much smaller than the cross-sectional areas of the crystallites to be formed, preferably in the tenth of a micron range.

As the next step in the invention, the single crystallites 7 of silicon, for example, are formed at the preselected sites 10 on the surface 5 of the silicon dioxide layer. This formation may be accomplished by placing the structure of FIG. 3 with the nucleation sites formed thereon in an epitaxial reactor containing the appropriate reactor components. For example, the structure may be placed in a reactor containing hydrogen and a silicon halide compound, for example $SiCl_4$ or $SiHCl_3$, the temperature of the reactor being maintained at from 1,000° to 1,300° C., the hydrogen gas and the halide compounds then reacting with each other at this temperature and depositing or growing the single crystallites 7. By introducing into the reactor N- or P-type impurities in suitable form, the conductivity type and/or concentration level may be controlled so as to produce the regions 7 of desired conductivity type and concentration level. The ultimate size or dimensions of the crystals may be controlled by carefully controlling the time of deposition, the temperature at which the reaction is carried out, and the varying concentrations of the reactor component. Using this process, single crystallites 7 have been obtained ranging in diameter from between one micron to several mils. The growth process can be observed through a microscope and thereby monitored.

Figure 5:
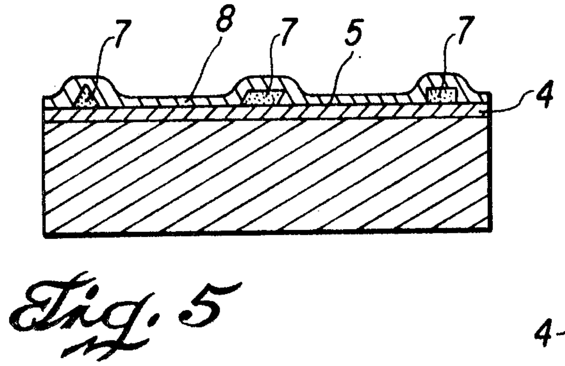
Figure 6:
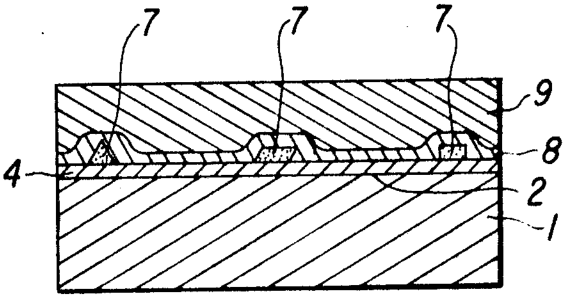

Thereafter, as illustrated in FIG. 5, a second layer 8 of insulating material, is deposited upon the surface 5 of the layer 4 and over the single crystal regions 7. This layer may also be formed in a vapor deposition reactor similar to that used in the formation of the layer 4. Thereafter, a substrate 9 of polycrystalline semiconductor material is deposited over the layer 8. Since this layer acts simply as a substrate in the final product, its thickness and material type are not critical but are to be compatible with the entire process and to provide a suitable handle. It has been convenient to deposit polycrystalline silicon to a thickness of approximately 8 or 9 mils. The resulting structure is illustrated in FIG. 6.

Thereafter the material of the original single crystalline silicon slice 1 is removed by etching or lapping so that the interface 2 between it and the first layer of insulating material 4 is exposed. If an etching solution is utilized which removes silicon semiconductor material, but substantially unaffects silicon dioxide, for example amine-catechol, the silicon dioxide layer 4 will then serve as an etch stop to limit the extent of the etching. The entire body is then inverted 180° to result in the structure illustrated in FIG. 7. The single crystallites 7 then form regions into which or upon which circuit components may be formed and thereafter interconnected to provide the desired circuit function of an integrated circuit. This component formation may be accomplished by ion implantation of appropriate impurities into the regions 7 or alternatively by the selective removal of the oxide layer 4 to provide windows or apertures over the single crystallite regions and thereafter diffusing opposite conductivity type impurities into each of these regions to form the desired circuit component; or alternatively, selectively etching and redepositing semiconductor material to form epitaxially deposited circuit components.

Referring now to FIGS. 8–13, there is described another aspect of the invention whereby the regions or crystallites of semiconductor material are randomly oriented on the surface of the insulating film rather than being formed at preselected nucleation sites. The initial steps of the process are identical to that described at the outside of this patent and consequently FIGS. 8 and 9 correspond identically to FIGS. 1 and 2, respectively.

Figures 8, 9, 10, 11, 12, 13:
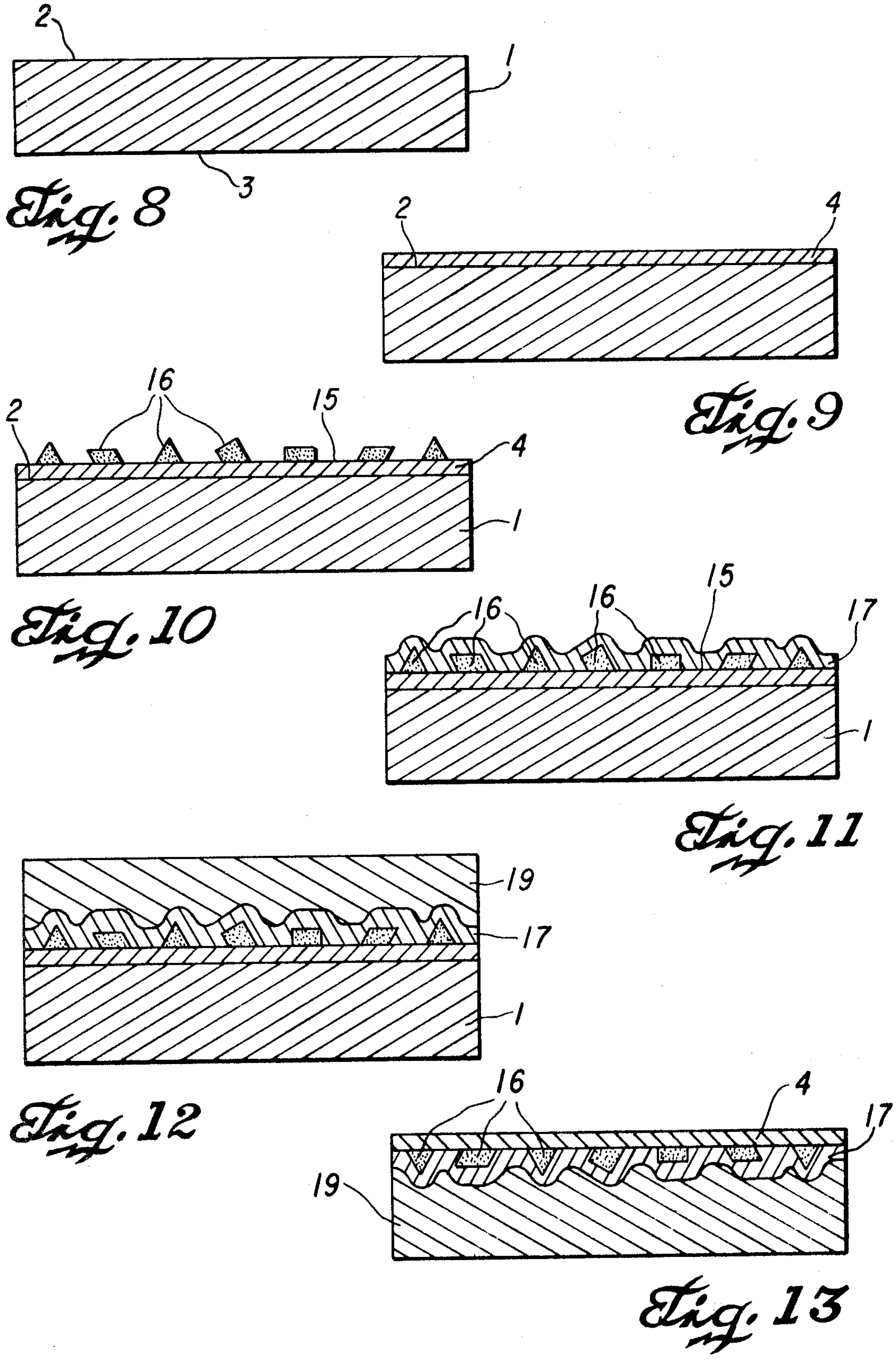
FIGS. 8–13 are elevational views, in section, taken at various stages of the fabrication of a segment of a substrate having the semiconductor crystallites randomly distributed thereon.

The structure of FIG. 9 is then placed in an epitaxial reactor containing the proper ratios of the reactive components hydrogen gas ($H_2$) and a silicon halide compound such as silicon tetrachloride ($SiCl_4$) or trichlorosilane ($SiHCl_3$) for a time sufficient to provide only the single crystallites 16. The ultimate size or dimensions of each of the crystallites, as well as the distance between crystallites (packing density) is a function of the deposition conditions (that is concentration of reactants, temperatures, flow rates, etc.), and care may thereby be exercised to obtain the desired number of nucleation sites for crystallite growth.

The distance between crystallites can also be affected by the ratio of silicon dioxide ($SiO_2$) to exposed silicon (Si). It has been found that the lower the $SiO_2$/Si ratio, the lesser the number of crystallite growths on the surface of the oxide layer 4. Consequently, by etching windows through the $SiO_2$ layer of varying widths and locations on the surface of the substrate 1 thereby exposing a corresponding portion of semiconductor material beneath these windows, the ratio of silicon dioxide to exposed silicon (and consequently the packing density of the crystallites 16) may be controlled.

Figure 7:
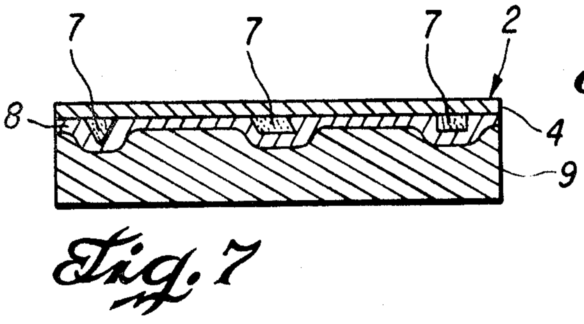

Thereafter the identical fabrication steps are carried out with reference to FIGS. 11–13 as were performed with reference to FIGS. 5–7 resulting in the structure shown in FIG. 13 whereby each of the single crystallites 16 are electrically isolated from one another and from a polycrystalline substrate 19 by a dielectric layer 17 of silicon dioxide or silicon nitride, for example, the insulating layer 4 overlying each of the single crystallite regions 16. Thereafter, in accordance with a specific feature of the invention, the locations or positions of the crystallite regions 16 may be determined and recorded by scanning the crystallites with a light beam and recording the reflections of the various points scanned, the information received from this recording being stored in a computer for future use.

Circuit components may then be formed from or in each of the crystallite regions 16 as before. For example, a mask may be utilized in conjunction with conventional photographic masking and etching techniques for selectively removing portions of the oxide layer 4 to expose corresponding portions of the single crystallite 16. Diffusions may then be selectively made through these exposed portions to create the desired conductivity types in each of the crystallites, thereby forming the active or passive circuit components. The mask used for selectively exposing the crystallites may be generated by garnering from the computer the stored information with respect to the location of each of the crystallites (this information accumulated during the scanning step above described), this garnered information then "drawing" or producing the mask.

While particular embodiments of the invention have been illustrated, it will be understood that the invention is not limited thereto for various other modifications of the methods of the invention will become apparent to persons skilled in the art without departing from the spirit and scope of the invention as defined by the appended claims.

What is claimed is:

1. A method for producing an integrated circuit structure having a plurality of single crystallites on a single substrate electrically isolated from said substrate and from one another by a layer of dielectric material, composing the steps of:

a. forming a layer of insulating material upon a supporting body, b. forming a plurality of nucleation sites upon said layer of insulating material, c. vapor depositing single crystallites of semiconductor material at each of said nucleation sites, d. depositing a layer of dielectric material upon said single crystallites, e. depositing a substrate upon said layer of dielectric material, f. removing said supporting body to expose said layer of insulating material, thereby to leave said single crystallites on said substrate electrically isolated from one another and said substrate by said layer of dielectric material, and g. forming individual circuit components within each of said single crystallites.

2. The method as described in claim 1 wherein said nucleation sites are provided by selective damaging of the said layer of insulating material.

3. The method as described in claim 2 wherein said selective damaging is by an electron beam.

4. A method for producing an integrated circuit structure having a plurality of single crystallites on a single substrate electrically isolated from said substrate and from one another by a layer of dielectric material, composing the steps of:

a. forming a layer of silicon dioxide insulating material upon a supporting body, b. forming a plurality of nucleation sites upon said layer of insulating material, c. vapor depositing single crystallites of silicon semiconductor material at each of said nucleation sites, d. depositing a layer of dielectric material upon said single crystallites, e. depositing a substrate of polycrystalline semiconductor material upon said layer of dielectric material, f. etching said supporting body to expose said layer of silicon dioxide, thereby to leave said single crystallites on said substrate electrically isolated from one another and said substrate by said layer of dielectric material, and g. forming individual circuit components within each of said single crystallites.

5. The method as described in claim 4 wherein said nucleation sites are provided by selective damaging of the said silicon dioxide layer.